(12) United States Patent
Lu et al.

(10) Patent No.: US 12,347,584 B2
(45) Date of Patent: Jul. 1, 2025

(54) CABLE

(71) Applicant: Tyco Electronics (Shanghai) Co., Ltd., Shanghai (CN)

(72) Inventors: Hainan (Harlan) Lu, Dongguan (CN); Zhiwei (Jack) Guo, Dongguan (CN)

(73) Assignee: Tyco Electronics (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 18/173,141

(22) Filed: Feb. 23, 2023

(65) Prior Publication Data

US 2023/0274856 A1 Aug. 31, 2023

(51) Int. Cl.
| | |
|---|---|
| *H01B 7/02* | (2006.01) |
| *H01B 7/08* | (2006.01) |
| *H01B 11/00* | (2006.01) |
| *H05K 9/00* | (2006.01) |

(52) U.S. Cl.
CPC ......... *H01B 11/002* (2013.01); *H01B 7/0225* (2013.01); *H05K 9/0098* (2013.01)

(58) Field of Classification Search
CPC .. H01B 7/0208; H01B 7/0807; H01B 7/0823; H01B 7/0838; H01B 7/0846
See application file for complete search history.

(56) References Cited

U.S. PATENT DOCUMENTS

| | | | | |
|---|---|---|---|---|
| 6,504,379 | B1 * | 1/2003 | Jackson | H01B 7/0861 |
| | | | | 174/117 F |
| 6,740,808 | B1 * | 5/2004 | Chang | H01B 7/0861 |
| | | | | 174/113 R |
| 8,378,217 | B2 | 2/2013 | Sugiyama et al. | |
| 8,975,521 | B2 * | 3/2015 | Huang | H01B 7/083 |
| | | | | 174/117 M |
| 9,123,452 | B2 * | 9/2015 | Sugiyama | H01P 11/001 |
| 11,227,705 | B2 * | 1/2022 | Hsiao | H01B 11/12 |
| 2018/0075948 | A1 * | 3/2018 | Kobayashi | H01B 7/36 |
| 2020/0098490 | A1 * | 3/2020 | Casher | H01B 11/002 |
| 2022/0130573 | A1 * | 4/2022 | Peng | H01B 11/1091 |
| 2023/0141502 | A1 * | 5/2023 | Kobayashi | H01B 11/002 |
| | | | | 174/126.1 |

* cited by examiner

*Primary Examiner* — Chau N Nguyen
(74) *Attorney, Agent, or Firm* — Barley Snyder

(57) ABSTRACT

A cable includes a pair of insulation core wires arranged to extend longitudinally parallel to each other, each of the insulation core wires has a central conductor and a wire insulation layer circumferentially wrapped around the center conductor, a first insulation tape layer and a second insulation tape layer wrapped outside the first insulation tape layer, and a metal shielding layer wrapped outside the second insulation tape layer. The first insulation tape layer is wrapped outside the wire insulation layers of the pair of insulation core wires to fix the pair of insulation core wires and cause the wire insulation layers of the pair of insulation core wires to abut against each other and deform at outer peripheries of a pair of sides of the wire insulation layers facing each other.

20 Claims, 5 Drawing Sheets

CABLE

CROSS-REFERENCE TO RELATED APPLICATION

This application claims the benefit of the filing date under 35 U.S.C. § 119(a)-(d) of Chinese Patent Application No. 202210182151.8, filed on Feb. 25, 2022.

FIELD OF THE INVENTION

Embodiments of the present disclosure relate generally to a cable, and more particularly, to a cable, such as a twinaxial cable, that is capable of data transmission at a high data transmission rate.

BACKGROUND

A conventional high-speed data transmission cable in structure mainly includes a pair of insulation core wires, a metal shielding layer wrapping around the insulation core wires, an insulating layer wrapping around the metal shielding layer, and a ground wire between the metal shielding layer and the insulating layer. However, the high-frequency test bandwidth realized by this conventional structure is low, and the electromagnetic shielding effect is poor. Further, in the process of bending and using, the insulating core wire shift easily, and performance stability is poor.

SUMMARY

A cable includes a pair of insulation core wires arranged to extend longitudinally parallel to each other, each of the insulation core wires has a central conductor and a wire insulation layer circumferentially wrapped around the center conductor, a first insulation tape layer and a second insulation tape layer wrapped outside the first insulation tape layer, and a metal shielding layer wrapped outside the second insulation tape layer. The first insulation tape layer is wrapped outside the wire insulation layers of the pair of insulation core wires to fix the pair of insulation core wires and cause the wire insulation layers of the pair of insulation core wires to abut against each other and deform at outer peripheries of a pair of sides of the wire insulation layers facing each other.

BRIEF DESCRIPTION OF THE DRAWINGS

The features of the present invention will become more apparent by describing in detail exemplary embodiments thereof with reference to the accompanying drawings, in which.

DETAILED DESCRIPTION OF THE EMBODIMENTS

Figure 1:
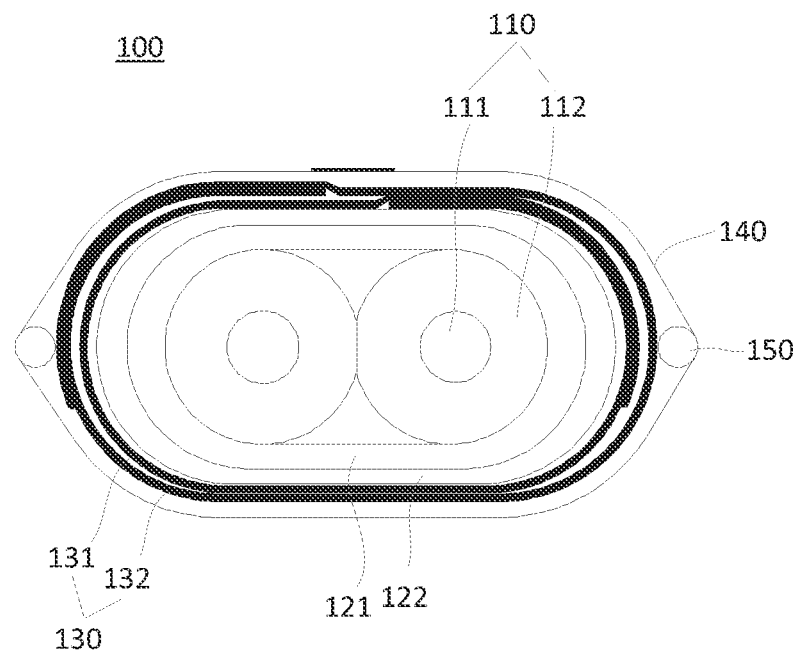
FIG. 1 is a radial cross-sectional view schematically showing a structure of a cable according to an exemplary embodiment of the present disclosure, wherein the cable includes two ground wires.

The technical solutions of the present disclosure will be specifically described below through the embodiments and in conjunction with the accompanying drawings. In the description, the same or similar parts are indicated by the same or similar reference numerals. The description of embodiments of the present disclosure hereinafter with reference to the accompanying drawings is intended to explain the general inventive concept of the present disclosure and should not be construed as a limitation on the present disclosure.

In addition, in the following detailed description, for the sake of explanation, numerous specific details are set forth in order to provide a thorough understanding of the disclosed embodiments. It will be apparent, however, that one or more embodiments may also be practiced without these specific details. In other instances, well-known structures and devices are illustrated schematically in order to simplify the drawing.

FIGS. 1 to 9 are radial cross-sectional views schematically showing a structure of a cable according to exemplary embodiments of the present disclosure.

As shown in FIGS. 1 to 9, according to exemplary embodiments of the present disclosure, there is provided the cable 100, such as a twinaxial or differential cable, for stable data transmission at a higher transmission rate, such as a speed higher than 60 Gbps.

As shown in FIGS. 1 to 9, the cable 100 according to exemplary embodiments of the present disclosure includes a pair of insulation core wires 110 for signal or data transmission. The pair of insulation core wires 110 is arranged to extend longitudinally parallel to each other, each of the insulation core wires 110 includes a central conductor 111 and a wire insulation layer 112 circumferentially wrapped around the center conductor 111. For example, the wire insulation layer 112 may be in the form of an insulation tape wound around the central conductor 111 in the longitudinal direction. The central conductor 111 can be made of high-conductivity materials such as copper conductors and silver-plated wires, and the wire insulation layer 112 can be made of insulating polymer materials such as polyolefin.

As shown in FIGS. 1 to 9, the cable 100 according to exemplary embodiments of the present disclosure further includes a first insulation tape layer 121 and a second insulation tape layer 122. The first insulation tape layer 121 and the second insulation tape layer 122 are made of insulating material such as polytetrafluoroethylene (PTFE). The first insulation tape layer 121 is wound outside the wire insulation layer 112 of the pair of insulation core wires 110 in the longitudinal direction, and the second insulation tape layer 122 is wound outside the first insulation tape layer 121 in the longitudinal direction.

Compared with conventional cables, the pair of insulation core wires 110 is fixed and the outer peripheries of the sides of the wire insulation layers 112 of the pair of insulation core wires 110 facing or close to each other is abutted against each other by wrapping the two layers of insulation tape 121, 122 outside the pair of insulation core wires 110, wherein the portions where the outer peripheries are in contact will be deformed under certain pressure, so that the contact surfaces of the wire insulation layers 112 of the two insulation core wires 110 changes from a curved surface to a flat surface, so that insulation OD is reduced to minimize the center-to-center distance of the central conductor 111 of the pair of insulation core wires 110, thereby increasing coupling to improve attenuation.

In an exemplary embodiment, the first insulation tape layer 121 can be bonded to the outer peripheral surfaces of the wire insulation layers 112 of the pair of insulation core wires 110, for example, by hot-melting. In other examples, the first insulation tape layer 121 may be bonded to the outer peripheral surfaces of the wire insulation layers 112 of the pair of insulation core wires 110, for example, by adhesive. Similarly, the second insulation tape layer 122 may be bonded to the outer peripheral surface of the first insulation tape layer 121, for example, by hot-melting. In other examples, the second insulation tape layer 122 may be bonded to the outer peripheral surface of the first insulation tape layer 121, for example, by adhesive.

In an exemplary embodiment, a winding direction of the first insulation tape layer 121 is opposite to that of the second insulation tape layer 122, to balance the tension of the cable 100. For example, the winding direction of the first insulation tape layer 121 is rightward (Z direction), while the winding direction of the second insulation tape layer 122 is leftward (S direction); or, the winding direction of the first insulation tape layer 121 is leftward (S direction), and the winding direction of the second insulation tape layer 122 is rightward direction (Z direction).

As shown in FIGS. 1 to 9, the cable 100 according to embodiments of the present disclosure includes a shielding layer 130. The shielding layer 130 is wrapped outside the second insulation tape layer 122 and is used to shield signals or data transmitted in the insulation core wire 110 from external electromagnetic interference, so as to provide an electromagnetic shielding effect.

As shown in FIGS. 1 to 9, the metal shielding layer 130 includes a first shielding layer 131 and a second shielding layer 132, wherein the first shielding layer 131 is wrapped outside the second insulation tape layer 122, and the second shielding layer 132 is wrapped outside the first shielding layer 131. For example, the first shielding layer 131 can be made of Cu/PP (copper and polypropylene) or Cu/PET (copper and polyethylene terephthalate) or other suitable materials, and the second shielding layer 132 can be made of AL/PP (aluminum and polypropylene) or AL/PET (aluminum and polyethylene terephthalate) or other suitable materials. It should be noted that, in some other embodiments of the present disclosure, the metal shielding layer 130 may include only one shielding layer or more shielding layers.

Figure 2:
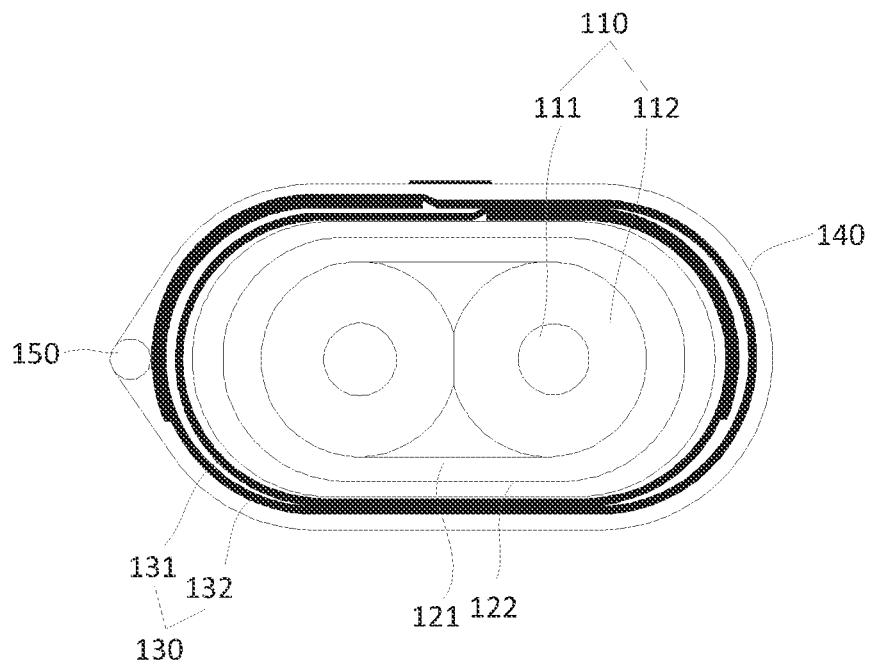
FIG. 2 is a radial cross-sectional view schematically showing the structure of the cable according to another exemplary embodiment of the present disclosure, wherein the cable includes one ground wire.
Figure 3:
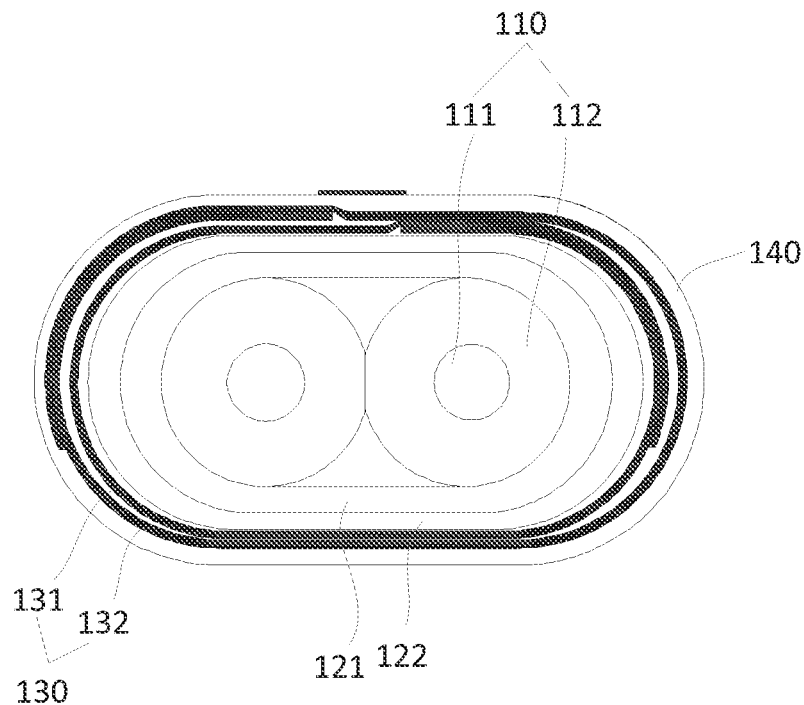
FIG. 3 is a radial cross-sectional view schematically showing the structure of the cable according to yet another exemplary embodiment of the present disclosure, wherein the cable is provided without ground wire.

As shown in FIGS. 1 to 3, the first shielding layer 131 and the second shielding layer 132 each have a first end and a second end in a radial cross-section, and the first end and the second end are located at different positions along the circumferential direction, so that the shielding layer forms a closed loop in the circumferential direction, thereby further improving the electromagnetic shielding effect. There is no seam between the first end and the second end, which can avoid the problem of inability to form a complete shielding ring since the seam becomes larger during the bending and using of the cable. As an example, each of the first shielding layer 131 and the second shielding layer 132 has a portion overlapping with each other between the first end and the second end, thereby further improving the electromagnetic shielding effect.

In an exemplary embodiment, as shown in FIGS. 1 to 3, an inner surface of the first shielding layer 131 and/or the second shielding layer 132 is provided with hot melt adhesive. Herein, the inner surface of the first shielding layer 131 and/or the second shielding layer 132 refers to the side of the corresponding shielding layer facing the insulation core wire 110. In this way, the first shielding layer 131 can be bonded to the wire insulation layers 112 of the pair of insulation core wires 110, and the first end and the second end of the first shielding layer 131 are bonded together, so that the first shielding layer 131 is formed in a closed loop in the circumferential direction. Similarly, the second shielding layer 132 can be bonded to the outer peripheral surface of the first shielding layer 131, and the first end and the second end of the second shielding layer 132 are bonded together, so that the second shielding layer 132 is formed in a closed loop in the circumferential direction.

In some other embodiments of the present disclosure, as shown in FIGS. 4 to 9, the first shielding layer 131 has a first end and a second end in a radial cross section, and the first end and the second end are located at different positions in the circumferential direction, so that the shielding layer is formed in a closed loop in the circumferential direction, thereby further improving the electromagnetic shielding effect. The first shielding layer 131 has overlapping parts between the first end and the second end, thereby further improving the electromagnetic shielding effect. The second shielding layer 132 may, for example, be in the form of a shielding tape wound outside the first shielding layer 131 in the longitudinal direction.

Figure 8:
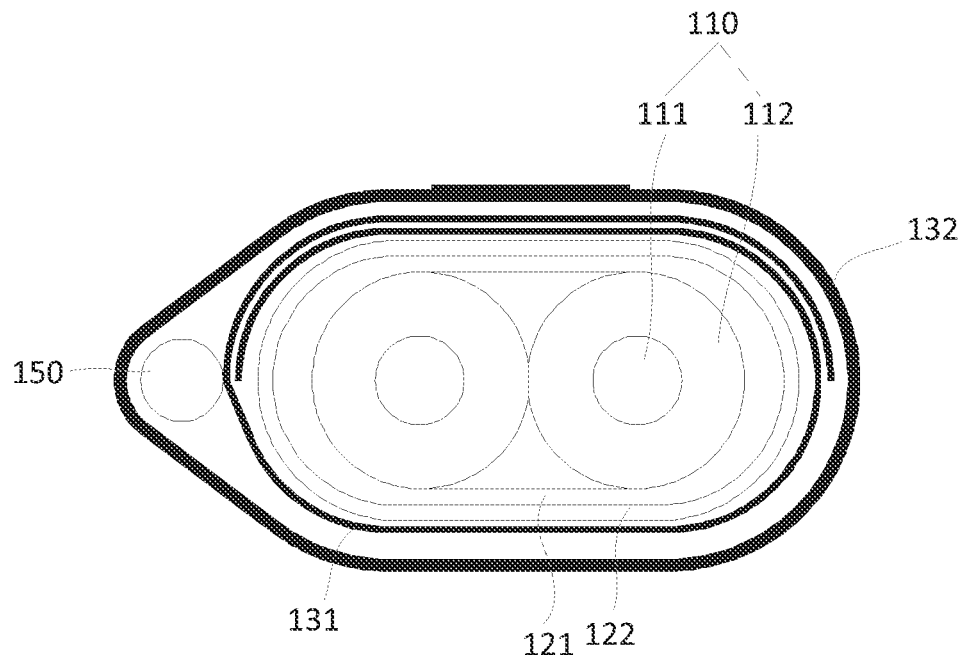
FIG. 8 is a radial cross-sectional view schematically showing the structure of the cable according to another exemplary embodiment of the present disclosure, wherein the cable includes one ground wire.
Figure 9:
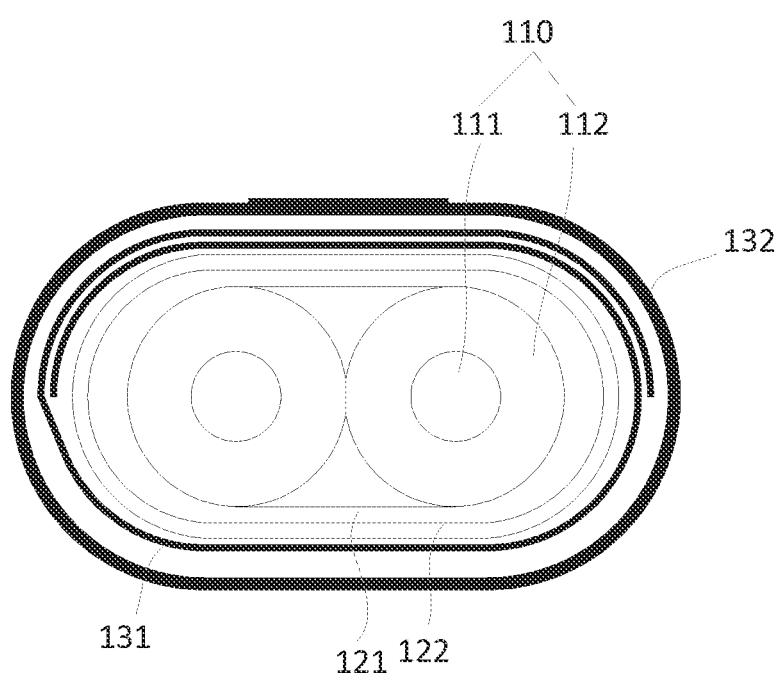
FIG. 9 is a radial cross-sectional view schematically showing the structure of the cable according to yet another exemplary embodiment of the present disclosure, wherein the cable is provided without ground wire.

In some embodiments, as shown in FIGS. 1 to 6, the cable 100 according to embodiments of the present disclosure further includes an outer sheath 140 wrapped circumferentially outside the outer peripheral surface of the second shielding layer 132 to provide a certain protection function. The outer sheath 140 may be in the form of a hot melt Mylar layer or an extruded/heat shrinkable sleeve. However, in some other embodiments of the present disclosure, as shown in FIGS. 7 to 9, a conductive surface of the outermost second shielding layer 132 faces inward (i.e., toward the insulation core wire 110), so that the side of the second shielding layer 132 opposite to the conductive surface can double as the outer sheath, so the cable 100 is provided without a separate outer sheath 140.

In some embodiments, as shown in FIGS. 1 to 2, the cable 100 further includes a ground wire 150 provided between the outer sheath 140 and the second shielding layer 132, so that the ground wire 150 is pressed against the outer peripheral surface of the second shielding layer 132 by the outer sheath 140. However, in some other embodiments of the present disclosure, as shown in FIGS. 4, 5, 7 and 8, the ground wire 150 is provided between the first shielding layer 131 and the second shielding layer 132, so that the ground wire 150 is pressed against the outer peripheral surface of the first shielding layer 131 by the second shielding layer 132.

Figure 4:
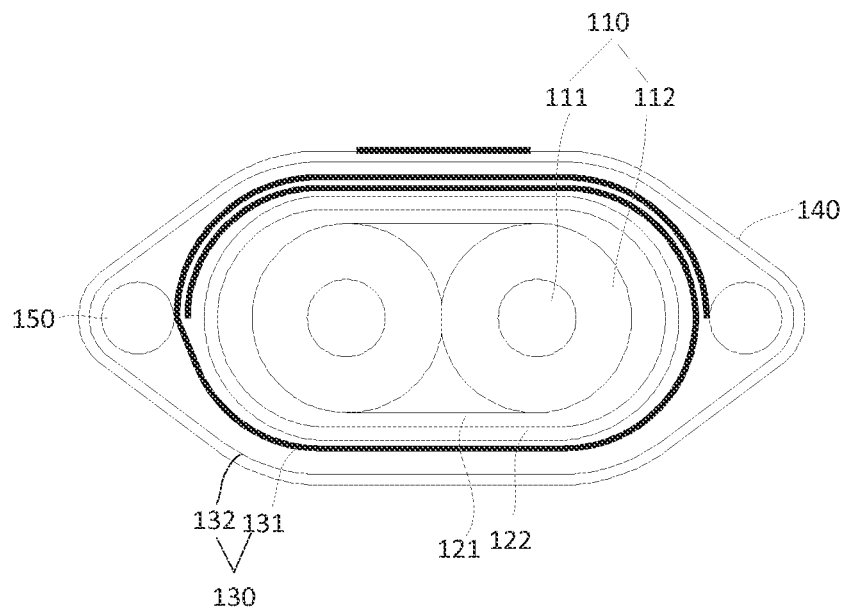
FIG. 4 is a radial cross-sectional view schematically showing the structure of the cable according to an exemplary embodiment of the present disclosure, wherein the cable includes two ground wires.
Figure 5:
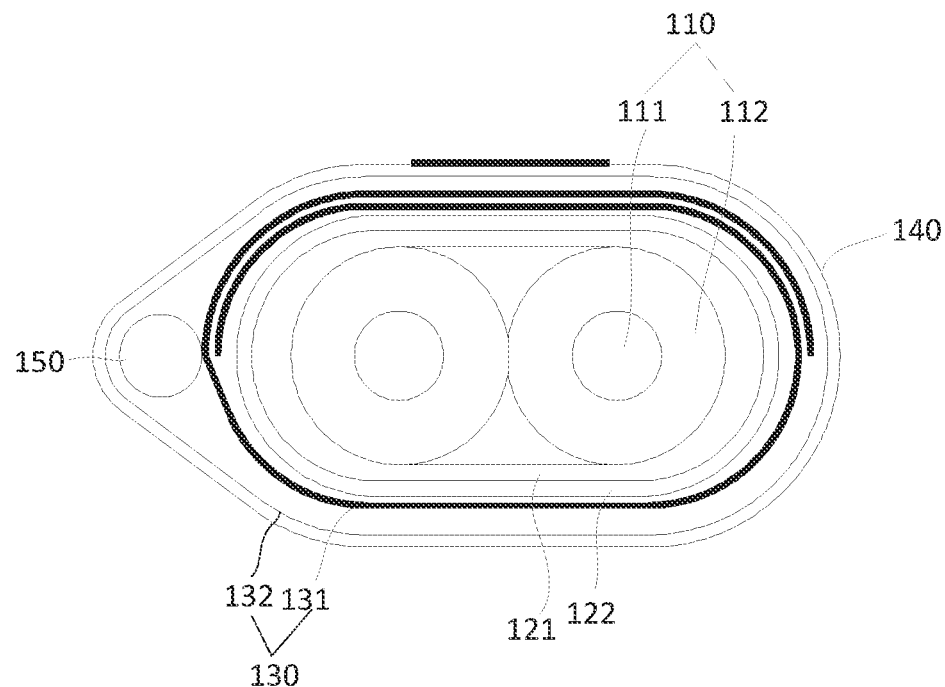
FIG. 5 is a radial cross-sectional view schematically showing the structure of the cable according to another exemplary embodiment of the present disclosure, wherein the cable includes one ground wire.
Figure 7:
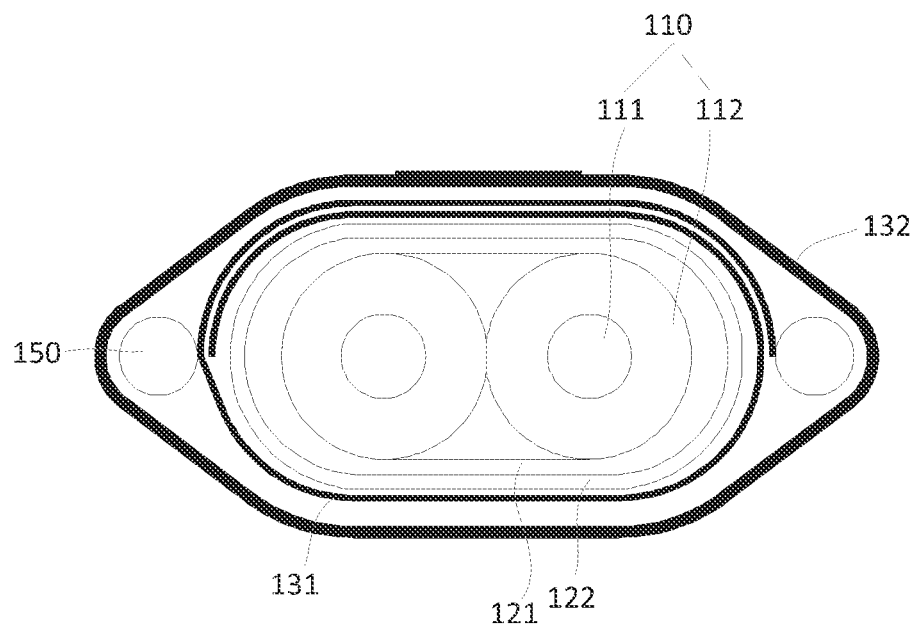
FIG. 7 is a radial cross-sectional view schematically showing the structure of the cable according to an exemplary embodiment of the present disclosure, wherein the cable includes two ground wires.

In the embodiments shown in FIGS. 1, 4 and 7, the cable 100 can include two ground wires 150 are located on radially opposite sides of the pair of insulation core wires 110, respectively. In some other exemplary embodiments, as shown in FIGS. 2, 5 and 8, the cable 100 can include a single ground wire 150 located on a side of the wire insulation layer 112 of one insulation core wire 110 in the pair of insulation core wires 110 away from the other insulation core wire 110 in a radial direction. For example, a center of the central conductor 111 of the pair of insulation core wires 110 and a center of the ground wire 150 can be located in a same radial plane, and the center of the ground wire 150 is located radially outside the center of the central conductor 111 of the pair of insulation core wires 110.

Figure 6:
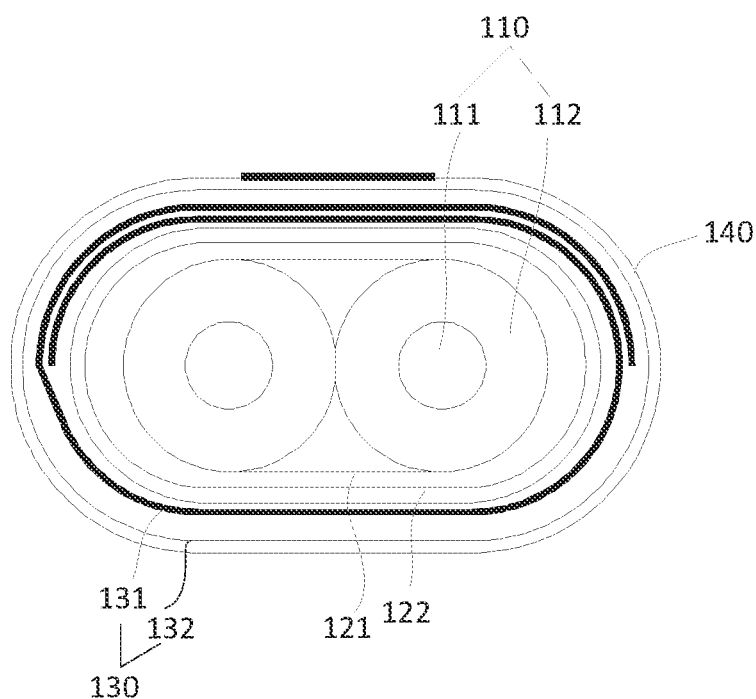
FIG. 6 is a radial cross-sectional view schematically showing the structure of the cable according to yet another exemplary embodiment of the present disclosure, wherein the cable is provided without ground wire.

In some embodiments of the present disclosure, the first shielding layer 131 and/or the second shielding layer 132 may serve as the ground wire suitable for electrical connection with an external ground. For example, as shown in FIGS. 3, 6 and 9, the cable is provided without a separate ground wire, but the first shielding layer 131 and/or the second shielding layer 132 can serve as the ground wire, thereby providing a more regular outlined cable.

According to the cable of the forgoing various embodiments of the present disclosure, the pair of insulation core wires are fixed and the outer peripheries of the sides of the wire insulation layers of the pair of insulation core wires facing or close to each other are abutted against each other by wrapping the two layers of insulation tape outside the pair of insulation core wires, herein, the portions where the outer peripheries are in contact will be deformed under certain pressure, so that the contact surfaces of the wire insulation layers of the two insulation core wires changes from a curved surface to a flat surface, so that the insulation OD is reduced to minimize a center-to-center distance of the central conductor of the pair of insulation core wires, thereby increasing coupling to improve attenuation. The cable can achieve higher bandwidth, up to 60 GB or higher, and the cable is more resilient when bent. In addition, the cable has good electromagnetic shielding effect and good performance stability.

Although some embodiments of the present disclosure have been shown and described, it would be appreciated by those skilled in the art that changes or modification may be made to these embodiments without departing from the principles and spirit of the present disclosure, the scope of which is defined in claims and their equivalents.

It should be noted that, unless otherwise specified, the word "comprise" or "include" or "have" used herein doesn't exclude other elements or steps. In addition, any reference numerals in the claims should not be interpreted as the limitation to the scope of the present disclosure.

What is claimed is:

1. A cable, comprising:
   a pair of insulation core wires arranged to extend longitudinally parallel to each other, each of the insulation core wires has a central conductor and a wire insulation layer circumferentially wrapped around the central conductor;
   a first insulation tape layer and a second insulation tape layer wrapped outside the first insulation tape layer, the wire insulation layers of the pair of insulation core wires are each a tape and the first insulation tape layer and the second insulation tape layer are wrapped outside the wire insulation layers of the pair of insulation core wires, a winding direction of the first insulation tape layer is opposite to a winding direction of the second insulation tape layer, the first insulation tape layer and the second insulation tape layer fix the pair of insulation core wires and cause the wire insulation layers of the pair of insulation core wires to abut against each other and deform at outer peripheries of a pair of sides of the wire insulation layers facing each other, decreasing a distance between the central conductors of the pair of insulation core wires; and
   a metal shielding layer wrapped outside the second insulation tape layer.

2. The cable according to claim 1, wherein the first insulation tape layer and the second insulation tape layer are made of polytetrafluoroethylene.

3. The cable according to claim 1, wherein the metal shielding layer has a first shielding layer and a second shielding layer.

4. The cable according to claim 3, wherein the first shielding layer is wrapped outside the second insulation tape layer, and the second shielding layer is wrapped outside the first shielding layer.

5. The cable according to claim 4, further comprising an outer sheath wrapped outside the second shielding layer.

6. The cable according to claim 5, wherein the outer sheath is one of a hot-melt Mylar layer, an extruded sleeve, and a heat-shrinkable sleeve.

7. The cable according to claim 5, further comprising a ground wire between the outer sheath and the second shielding layer, the ground wire is pressed against an outer peripheral surface of the second shielding layer by the outer sheath.

8. The cable according to claim 7, wherein the ground wire is one of a pair of ground wires located on radially opposite sides of the pair of insulation core wires.

9. The cable according to claim 7, wherein the ground wire is located on a side of the wire insulation layer of one of the insulation core wires away from the other of the insulation core wires in a radial direction.

10. The cable according to claim 9, wherein a center of the central conductors of the pair of insulation core wires and a center of the ground wire are located in a same radial plane.

11. The cable according to claim 5, further comprising a ground wire between the first shielding layer and the second shielding layer, the ground wire is pressed against an outer peripheral surface of the first shielding layer by the second shielding layer.

12. The cable according to claim 4, further comprising a ground wire between the first shielding layer and the second shielding layer, the ground wire is pressed against an outer peripheral surface of the first shielding layer by the second shielding layer.

13. The cable according to claim 12, wherein a conductive surface of the second shielding layer faces the first shielding layer.

14. The cable according to claim 13, wherein the cable does not have a separate outer sheath.

15. The cable according to claim 4, wherein the second shielding layer is in direct contact with the first shielding layer.

16. The cable according to claim 3, wherein the first shielding layer is made of copper and polypropylene or copper and polyethylene terephthalate.

17. The cable according to claim 3, wherein the second shielding layer is made of aluminum and polypropylene or aluminum and polyethylene terephthalate.

18. The cable according to claim 3, wherein an inner surface of the first shielding layer has a hot melt adhesive.

19. The cable according to claim 3, wherein an inner surface of the second shielding layer has a hot melt adhesive.

20. The cable according to claim 1, wherein the metal shielding layer is electrically connectable with an external ground and the cable does not have a separate ground wire.

* * * * *